United States Patent
Grebennikov et al.

(10) Patent No.: US 10,418,947 B2
(45) Date of Patent: Sep. 17, 2019

(54) DOHERTY AMPLIFIER

(71) Applicant: SUMITOMO ELECTRIC DEVICE INNOVATIONS, INC., Yokohama-shi, Kanagawa (JP)

(72) Inventors: Andrey Grebennikov, Herts (GB); James Wong, Surrey (GB); Naoki Watanabe, London (GB)

(73) Assignee: SUMITOMO ELECTRIC DEVICE INNOVATIONS, INC., Yokohama-Shi, Kanagawa (JP)

(*) Notice: Subject to any disclaimer, the term of this patent is extended or adjusted under 35 U.S.C. 154(b) by 0 days.

(21) Appl. No.: 15/909,477

(22) Filed: Mar. 1, 2018

(65) Prior Publication Data

US 2018/0254749 A1    Sep. 6, 2018

Related U.S. Application Data

(63) Continuation-in-part of application No. 15/827,541, filed on Nov. 30, 2017, now Pat. No. 10,187,015.

(Continued)

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/0211* (2013.01); *H03F 1/56* (2013.01); *H03F 3/195* (2013.01); *H03F 3/211* (2013.01); *H03F 3/213* (2013.01); *H03F 3/245* (2013.01); *H03F 3/602* (2013.01); *H03F 2200/192* (2013.01); *H03F 2200/222* (2013.01); *H03F 2200/336* (2013.01); *H03F 2200/387* (2013.01);
(Continued)

(58) Field of Classification Search
CPC .................. H03F 1/0288; H03F 3/68
USPC ............................. 330/124 R, 295
See application file for complete search history.

(56) References Cited

U.S. PATENT DOCUMENTS 6,737,922 B2 * 5/2004 Pengelly ............... H03F 1/0277
330/124 R
9,667,199 B1    5/2017 McLaren
(Continued)

FOREIGN PATENT DOCUMENTS

EP    2403135    1/2012

OTHER PUBLICATIONS

Office Action per *Ex Parte Quayle* in co-pending U.S. Appl. No. 15/909,394 issued on Mar. 11, 2019.

*Primary Examiner* — Steven J Mottola
(74) *Attorney, Agent, or Firm* — Smith, Gambrell & Russell, LLP (57) ABSTRACT

An N-way Doherty Amplifier (N>3) is disclosed. The Doherty Amplifier includes an N-way power divider that evenly divides an input signal, a delay adjustor, one carrier amplifier and N−1 peak amplifiers each including offset lines for converting amplifier output impedance thereof to be substantially short circuit when the amplifiers are turned off, and an output combiner including a common node. The carrier amplifier, the first peak amplifier, and the rest peak amplifiers are coupled with the common node directly, through one λ/4 line, and respective λ/4 lines connected in series to the common node, respectively. The delay adjustor makes up a number of λ/4 lines in respective paths.

9 Claims, 5 Drawing Sheets

Related U.S. Application Data

(60) Provisional application No. 62/465,516, filed on Mar. 1, 2017.

(51) Int. Cl.
*H03F 3/195* (2006.01)
*H03F 3/21* (2006.01)
*H03F 3/213* (2006.01)
*H03F 1/56* (2006.01)
*H03F 3/24* (2006.01)
*H03F 3/60* (2006.01)

(52) U.S. Cl.
CPC .. *H03F 2200/405* (2013.01); *H03F 2200/423* (2013.01); *H03F 2200/451* (2013.01); *H03F 2203/21103* (2013.01); *H03F 2203/21139* (2013.01)

(56) References Cited

U.S. PATENT DOCUMENTS

| | | |
|---|---|---|
| 2008/0284509 A1 | 11/2008 | Kim et al. |
| 2013/0154731 A1 | 6/2013 | Gajadharsing |
| 2013/0265107 A1 | 10/2013 | Holmes |
| 2016/0248383 A1* | 8/2016 | Otake ............. H03F 1/0288 |
| 2018/0034419 A1* | 2/2018 | Moronval ......... H03F 1/0288 |

* cited by examiner

DOHERTY AMPLIFIER

CROSS REFERENCE TO RELATED APPLICATIONS

The present application is a continuation-in-part of pending prior U.S. patent application Ser. No. 15/827,541, filed Nov. 30, 2017, which claims a benefit of U.S. Provisional Patent Application Ser. No. 62/427,931, filed Nov. 30, 2016. The present application claims a priority under 35 U.S.C. § 119 of U.S. Provisional Application Ser. No. 62/465,516, filed on Mar. 1, 2017; the contents of which is relied on and incorporated herein by reference in its entirety.

BACKGROUND OF THE INVENTION

1. Field of Invention

The present invention relates to a Doherty amplifier, in particular, relates to Doherty amplifiers having two or more peak amplifiers.

2. Related Prior Arts

In most communication systems, a power amplifier is requested to be operable in high efficiencies with high linearity. However, the efficiency and the linearity in an amplifier generally show a tradeoff relation. Besides, many wireless communications systems, such as GSM (Global System Mobile communication)/EDGE (Enhanced Data Rates for GSM Evolution), CDMA2000 (Code Division Multiple Access 2000), WCDMA (Wideband Code Division Multiple Access)/LTE (Long Term Evolution), or the like, require that a power amplifier be able to deliver a wide range of output power. As a result, when the highest power level is designed accompanied with maximum available efficiency, the power amplifiers implemented in base stations tend to show lesser efficiency at lower power levels, which results in consumption of a lot of extra dc power. Accordingly, it is a real challenge to design a power amplifier implemented within the base station that has high efficiency not only at maximum output power but also at lower power levels typically ranging from −6 dB and less, with minimum size and lower cost.

SUMMARY OF INVENTION

The present invention relates to an N-way (N>3) Doherty Amplifier coupled with a load that has a characteristic impedance of $Z_0$. The N-way Doherty Amplifier comprises a carrier amplifier (CA), (N−1) counts of peak amplifiers (PAs), an N-way power divider, a phase compensator, and an output combiner. The carrier amplifier includes an offset line with characteristic impedance in an output thereof. The offset line converts the output impedance of the carrier amplifier into a substantially short-circuit when the carrier amplifier is turned off. The (N−1) counts of peak amplifiers include a first, second, and the rest of the N−2 peak amplifiers. Each of the peak amplifiers has a configuration the same as a configuration of the carrier amplifier and includes an offset line in an output thereof that converts the output impedance thereof into a substantially short circuit when the peak amplifier is being turned off. The N-way power divider evenly divides an input signal into N-counts of divided signals provided to the carrier amplifier and the peak amplifiers and each having phases substantially aligned to each other. The phase compensator includes a first quarter-wavelength line corresponding to the carrier amplifier, a second quarter-wavelength line corresponding to a first peak amplifier, and other quarter-wavelength lines corresponding to the rest of the peak amplifiers. The first quarter-wavelength line has an electrical length of $(N-2)*\lambda/4$, where $\lambda$ is a wavelength of the input signal. The second quarter-wavelength line has an electrical length of $(N-3)*\lambda/4$. The other quarter-wavelength lines have an electrical length of $(N-k-1)*\lambda/4$, where k is a consecutive number from 2 to N−1. The quarter-wavelength lines have the characteristic impedance $Z_0$. The output combiner includes a common node and (N−1) counts of quarter-wavelength lines including a first and rest of the quarter-wavelength lines each corresponding to the first peak amplifier and the rest of the peak amplifiers, respectively. The carrier amplifier is directly coupled with the common node. The first peak amplifier is coupled with the common node through the first quarter-wavelength line. The j-th peak amplifier, j=2 to N−1, in the rest of the peak amplifiers is coupled with the common node through i-th quarter-wavelength lines, i=j−1 to 2, that are connected in series to the common node.

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF EMBODIMENTS

Figure 1:
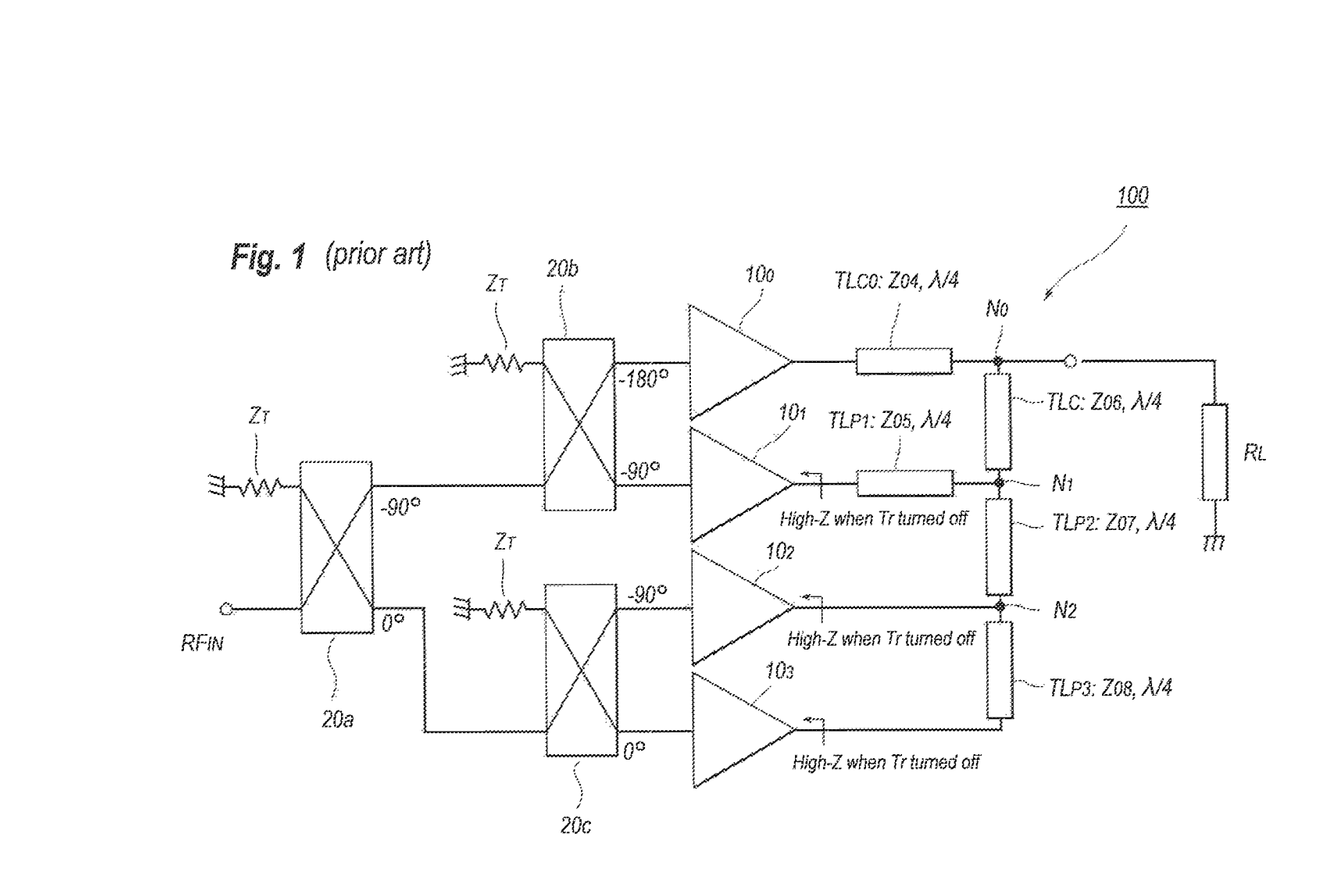
FIG. 1 shows a functional block diagram of a conventional multi-way Doherty amplifier that is comparable with the present invention.

FIG. 1 schematically shows the functional block diagram of a conventional four-way Doherty amplifier that implements amplifiers having sizes of 1:1:1:1, where one carrier amplifier (CA) $10_0$ and three peaking amplifiers (PAs), $10_1$ to $10_3$, are combined in a four-way Doherty configuration. The configuration of the Doherty amplifier 100 shown in FIG.1 shows the maximum efficiency at back-off of −12 dB from the saturation. In the arrangement of FIG. 1, all amplifiers, $10_0$ to $10_3$, are turned on at saturation, and only the CA $10_0$ is turned on so as to show the maximum efficiency at the back-off that is smaller than the saturation by 12 dB where the CA $10_0$ sees the load of 200 Ω for $R_L=Z_{04}=Z_{05}=Z_{08}=50$ Ω. The CA $10_0$ is biased in Class AB to perform linear amplification for low envelope signals, while the PAs, $10_1$ to $10_3$, are biased in Class C with different bias voltages below the threshold to amplify the higher envelope signals. The input power divider includes three quadrature couplers, 20a to 20c, that split input power equally over the CA $10_0$ and the PAs, $10_1$ to $10_3$, and provide the required phase shifts. Each of the PAs, $10_1$ to $10_3$, also includes the output matching circuit and offset lines therein to provide the high impedance viewed from the outputs thereof when the respective PAs, $10_1$ to $10_3$, are turned off.

However, in view of presence of the parasitic components around the amplifiers or transistors implemented within the amplifiers, such as shunt output capacitance, a bonding wire connected in series thereto, and lead inductor of the packages; the PAs, $10_1$ to $10_3$, in the output thereof easier provide a characteristic of a short circuit rather than an open circuit in a low-power region at turning off. In such a case, the shunt capacitance and series inductance compose the series resonant circuit with the series resonance frequency close to the carrier frequency subject to the Doherty amplifier. Using an additional offset line with a short-length; the resonant point may be properly tuned to the carrier frequency. Accordingly, the overall structure of the four-way Doherty amplifier may be simplified for practical implementation providing the maximum efficiency peak at the back-off point smaller by 12 dB from the saturation. Besides, a difference in the characteristic impedance between $Z_{06}$ and $Z_{08}$ in FIG. 1 becomes significant, with ratio of 3 in a 50 Ω environment when $Z_{04}=Z_{05}=Z_{08}=50$ Ω while $Z_{07}=25$ Ω and $Z_{06}=16.7$ Ω.

First Embodiment

Figure 2:
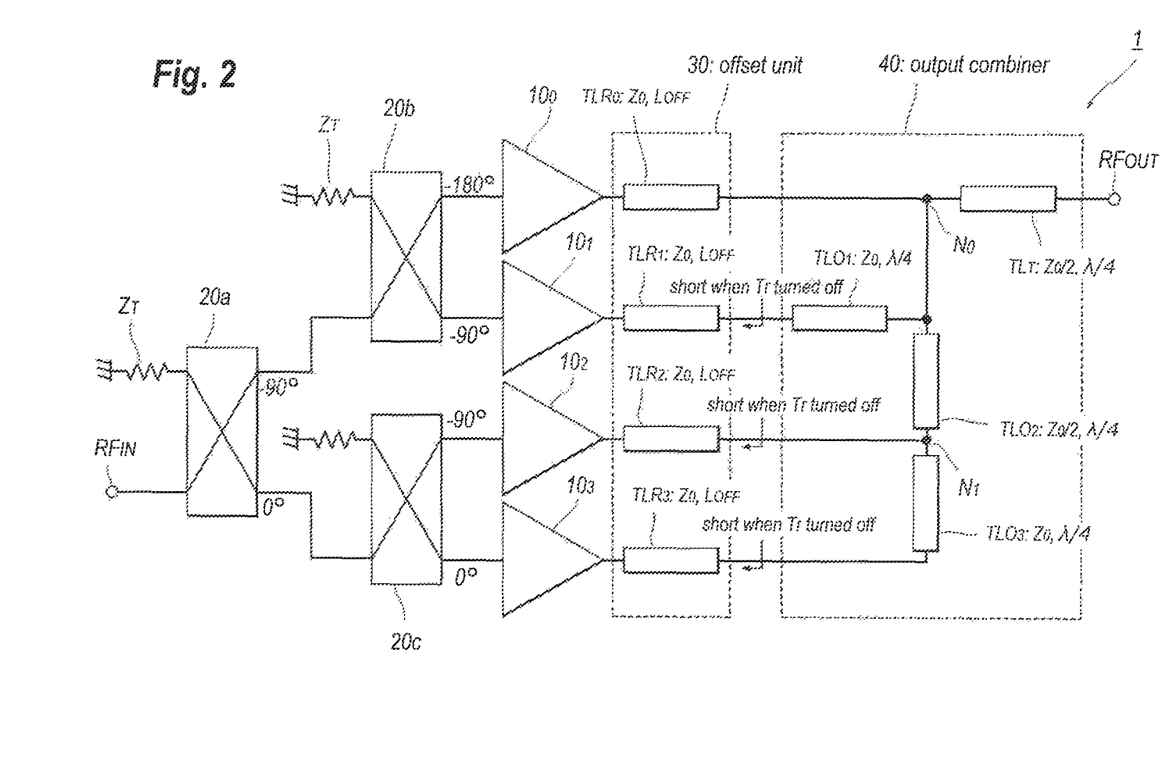
FIG. 2 shows a functional block diagram of a Doherty amplifier according to the first embodiment of the present invention.

FIG. 2 schematically shows a functional block diagram of the inverted four-way Doherty configuration with the device size ratio of 1:1:1:1,where the maximum ratio between the transmission-line characteristic impedances of 50 Ω/25 Ω=2 only in a 50 Ω environment when $Z_0=R_L=50$ Ω. Three quadrature couplers, $20a$ to $20c$, are used at the input to equally split the input signal over four amplifiers, $10_0$ to $10_3$. The description below assumes that the CA means the carrier amplifier, and $PA_1$ to $PA_3$ mean the first to third peaking amplifiers, $10_1$ to $10_3$, respectively. All amplifiers, $10_0$ to $10_3$, include the input and output matching circuits, whose configurations fully depend on the corresponding device impedances for particular applications to match to 50 Ω source and the load impedance.

The offset unit 30 is necessary to provide the low impedance at outputs thereof when the PAs, $10_1$ to $10_3$, are turned off. All amplifiers, $10_0$ to $10_3$, are turned on at the saturation, while only the CA is turned on but the PAs, $10_1$ to $10_3$, are turned off to provide a peak efficiency of the Doherty amplifier 1 at a back-off that is smaller by 12 dB from the saturation. The CA $10_0$ and only the first PA $10_1$ are turned on to provide efficiency peak at another output power back-off that is smaller by 6 dB from the saturation, then, the CA $10_0$ and two PAs, $10_1$ and $10_2$, are turned on for providing another peak efficiency at an output power smaller than the saturation but higher than the second back-off level, namely, smaller than the saturation by 6 dB. In a low power region where all PAs, $10_1$ to $10_3$, are turned off, the output matching circuit of CA in conjunction with the corresponding series quarter-wavelength line TLRo in the offset unit 30 should provide the impedance transformation when the high impedance is seen by the transistor in the CA $10_0$. An additional efficiency peak at the power level smaller than the saturation by 6 dB may be achieved by turning off the $PA_3$ but the CA, the $PA_1$ and the $PA_2$ are turned on. The common node $N_0$ in the output combiner 40 is coupled to the load with impedance of 50 Ω through the λ/4 impedance converter $TL_T$.

Figure 5A:
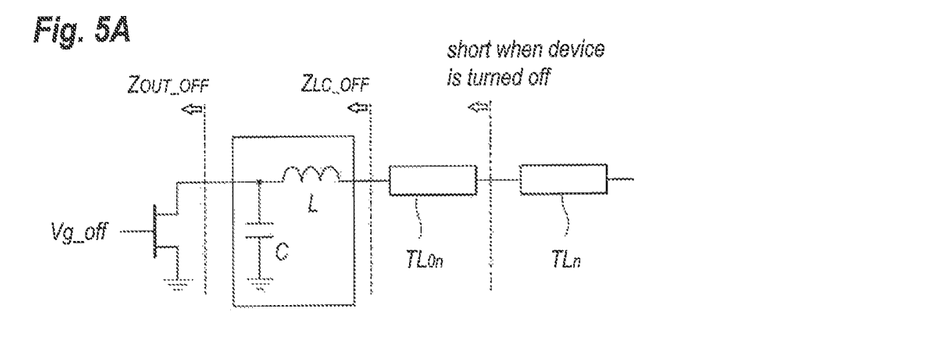
FIG. 5A schematically shows a circuit diagram of an offset unit for a carrier amplifier and a peak amplifier.

In lower output power where only the CA $10_0$ operates, all of the PAs, $10_1$ to $10_3$, are turned off so as to show output impedance thereof large enough; but the devices in the PAs, $10_1$ to $10_3$, are strictly not regarded as an open circuit. For instance, when the peak amplifiers, $10_1$ to $10_3$, are configured with respective field effect transistor (FET), a junction capacitor between the drain and the source thereof, parasitic inductance due to bonding wires wire-boned with the drain electrode, and so on makes the output impedance of the FET not to be an open circuit. FIG. 5A schematically illustrates a primary portion of a circuit diagram around an FET implemented within the amplifiers, $10_0$ to $10_3$, while, FIG. 5B indicates a smith chart of the circuit shown in FIG. 5A.

Figure 5B:
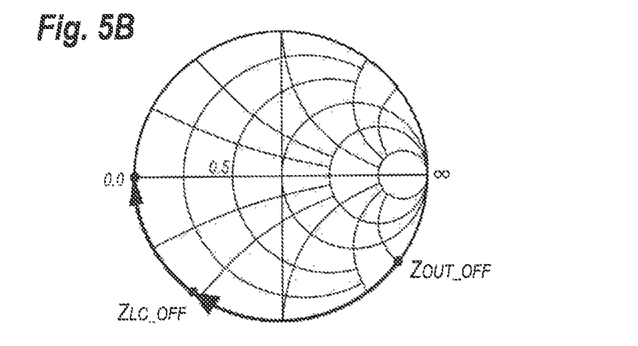
FIG. 5B shows an impedance behavior of the offset unit shown in FIG. 5A.

The FET in the amplifier inevitably accompanies with the junction capacitance between the drain and the source, and the inductance due to the bonding wire to extract an output from the drain. Assuming the output impedance of the FET seeing the inside at the drain thereof to be $Z_{OUT\_OFF}$, this impedance $Z_{OUT\_OFF}$ shifts from the open circuit ∞ on the smith chart as shown in FIG. 5B. Referring to FIG. 5A, the FET in the drain thereof couples with a matching circuit including, for instance, a capacitor C and an inductor L, where the capacitor C is not the junction capacitance between the drain and the source of the FET but the inductor L corresponding to the inductance attributed to the bonding wire connected between the drain of the FET and the offset transmission line $TL_{On}$. The matching circuit moves, or rotates clockwise from the $Z_{OUT\_OFF}$ to the $Z_{LC\_OFF}$, that is, the impedance $Z_{LC\_OFF}$ corresponds to impedance seeing the FET at the end of the offset transmission line $TL_{On}$.

The offset transmission lines, $TL_{00}$ to $TL_{03}$, in the offset unit 30 have the electrical length corresponding to rotate the point $Z_{LC\_OFF}$ to the short circuit (Z=0). Because the point $Z_{LC\_OFF}$ positions in the edge on the smith chart, the offset transmission lines, $TL_{00}$ to $TL_{03}$, have the characteristic impedance of $Z_0$, and the electrical length $L_{OFF}$ so as to rotate the point from the point $Z_{LC\_OFF}$ to the short circuit (Z=0) in the left end, where an example shown in FIG. 5B has the electrical length about λ/16.

Second Embodiment

Figure 3:
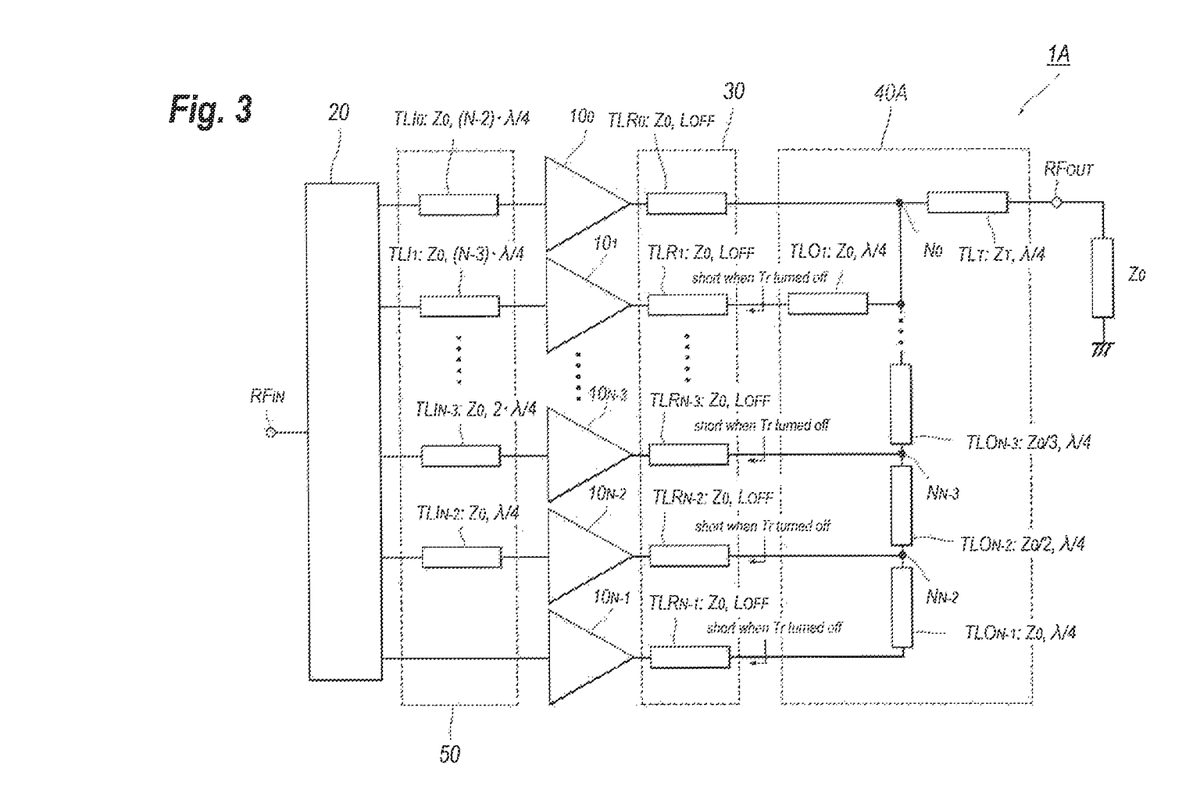
FIG. 3 shows a functional block diagram of a Doherty amplifier according to the second embodiment of the present invention.

FIG. 3 shows a general extension of the basic four-way Doherty arrangement to an N-way Doherty arrangement in a general form thereof where the general form of a Doherty amplifier 1A comprises one CA $10_0$ that is coupled with the common node $N_0$ through an offset line $TLR_0$, the first peaking amplifier $10_1$ that is coupled with the common node No through the offset line $TLR_1$ and the quarter-wavelength line $TLO_1$. The arrangemnet shown in FIG. 3 further includes N−2 counts of the PAs, $10_2$ to $10_{N−1}$, that are coupled with the common node No through offsett lines, $TLR_2$ to $TLR_{N−1}$, and λ/4 impedance converters, $TLO_2$ to $TLO_{N−1}$, each connected in series to the common node $N_0$.

Specifically, the first quarter-wavelength line $TLO_0$ has a length of (N−2)×λ/4, the second quarter-wavelength line $TLI_1$ has a length of (N−3)×λ/4; while, other quarter-wavelength lines corresponding to the PAs $10_k$, k=2 to N−1, have lengths of (N−k−1)* λ/4, respectively. According to the arrangement for the phase compensator 50 thus described, the quarter-wavelength line for the second PA $10_2$, namely k=2, has the length of (N−3)*λ/4, which is equal to the quarter-wavelength line $TLI_1$ for the first PA $10_1$; that for the PA $10_{N−3}$ has the length of (N−N+3−1)*λ/4=2*λ/4; that for the PA $10_{N−2}$ has the length of (N−N+2−1)*λ/4=λ/4;and that for the last PA $10_{N−1}$ has no length. That is, the phase compensator 50 omits the quarter-wavelength line in the Nth path.

The amplifiers, $10_0$ to $10_{N−1}$, in outputs thereof are coupled with the common node $N_0$ through the offset lines, $TLR_0$ to $TLR_{N−1}$, and quarter-wavelength lines, $TLO_1$ to $TLO_{N−1}$. The functions of the offset lines, $TLR_0$ to $TLR_{N−1}$, are same with those already described in FIG. 5; that is, the offset lines, $TLO_0$ to $TLO_{N−1}$, convert the impedance of the PAs, $10_1$ to $10_{N−1}$, in a short circuit when the PAs, $10_1$ to $10_{N−1}$, are turned off. The first offset line $TLR_0$ for the CA $10_0$ is directly coupled with the common node $N_0$, while, the offset line $TLR_1$ for the first PA $10_1$ is coupled with the common node through the quarter-wavelength line $TLO_1$. Rest of the offset lines, $TLR_2$ to $TLR_{N-1}$, are coupled with the common node through offset lines set upstream to the common node $N_0$. That is, the third offset line $TLR_2$ is coupled with the common node $N_0$ through the quarter-wavelength line $TLO_2$; and generally, the k-th offset line $TLR_k$, k=2 to N−1, is coupled with the common node $N_0$ through the impedance converters $TLO_j$, j=k to 2. Accordingly, the last offset line $TLR_{N-1}$ for the last PA $10_{N-1}$ is coupled with the common node $N_0$ through the impedance converters, $TLO_{N-1}$ to $TLO_2$.

Thus, the first path that includes the CA $10_0$ has (N−2) counts of the quarter-wavelength lines from the N-way power divider 20 to the common node $N_0$; the second path that includes the first PA $10_1$ also has (N−2) counts of the quarter-wavelength lines; third path for the second PA $10_2$ also has (N−2) counts of the quarter-wavelength lines; and the Nth path for the last PA 10N−1 also has (N−2) counts of the quarter-wavelength lines. Accordingly, signals passing through the respective paths are aligned in the phases thereof at the common node $N_0$.

The common node $N_0$ is coupled with the load whose impedance is $Z_0$ through the λ/4 impedance converter $TL_T$ whose impedance $Z_T$ is given by:

$$Z_T = Z_0/\sqrt{N},$$

where $Z_0$=50 Ω and N is the total number of the amplifiers, namely, the count of the PAs plus one (1) for the CA $10_0$.

Figure 4:
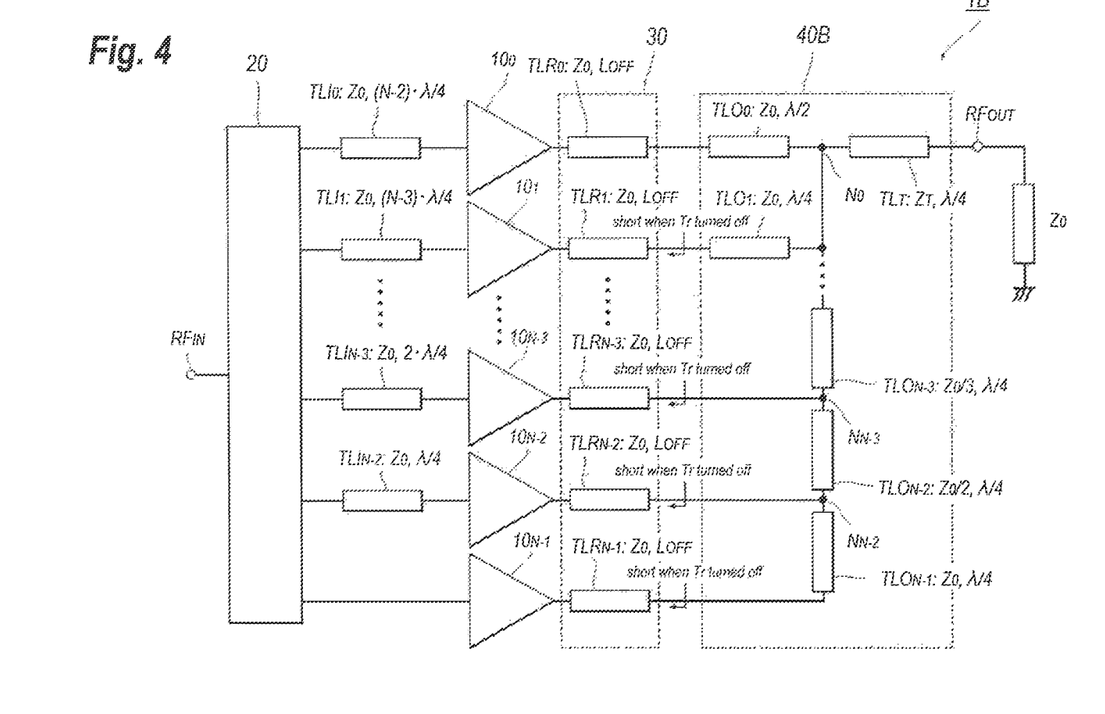
FIG. 4 shows a functional block diagram of a Doherty amplifier modified from the second embodiment shown in FIG. 3.

In some cases, especially when the CA $10_0$ is necessary to output very high power with small impedance at the output thereof, the CA $10_0$ becomes hard to be physically connected to the common node $N_0$ through no substantial length. In such a case, the CA $10_0$ in the output thereof may interpose an additional transmission line $TLO_0$ with a half wavelength λ/2 for a signal subject to the Doherty amplifier 1B between the offset line and the common node $N_0$ as shown in FIG. 4.

In summary, the Doherty amplifier of the present invention provides an N-way inverted configuration, where one embodiment of the Doherty amplifier provides the four-way configuration that includes one CA $10_0$ and three PAs, $10_1$ to $10_3$, the input power divider 20, the offset unit 30, and the output combiner 40. Each of the CA $10_0$ and the PAs, $10_1$ to $10_3$, has input and output matching circuits therein. The CA $10_0$ and the PAs, $10_1$ to $10_3$, are configured to operate such that the PAs, $10_1$ to $10_3$, sequentially switch as an increase of the input power in this turn.

The N-way power divider 20 is coupled between an input terminal $RF_{IN}$ and respective inputs of the CA $10_0$ and the PAs, $10_1$ to $10_3$. The outputs of the CA $10_0$ and the PAs, $10_1$ to $10_3$, are coupled with an output terminal $RF_{OUT}$ through the offset unit 30 and the output combiner 40. The CA $10_0$ is coupled with the common node $N_0$ through the offset line $TLR_0$ in the first path without any impedance inverters, namely, quarter-wavelength lines. The second path is coupled with the common node $N_0$ from the first PA $10_1$ through the offset line $TLR_1$ and the impedance converter $TLO_1$ with a quarter-wavelength. Each of the remaining paths includes a PA $10_k$(k=2 to N−1), the offset line TLRk (k=2 to N−1), and the impedance converters, $TLO_j$ (j=k to 2). The PAs, $10_1$ to $10_{N-1}$, are connected in parallel with respect to the common node $N_0$ through the impedance converters $TLO_j$(j=k to 2), where the impedance converter $TLO_k$ provides an open circuit in the output thereof when the $PA_k$ is turned off because the output of the offset line $TLR_k$ may be regarded as substantially a short circuit. The impedance of each of the impedance converters $TLO_k$ is selected to provide the power combining when the CA $10_0$ and all N−1 counts of the PAs, $10_1$ to $10_{N-1}$, are turned on. The common node $N_0$ is coupled with the load through the impedance converter $TL_T$ with a quarter wavelength whose impedance depends on a number of the PAs, $10_1$ to $10_{N-1}$.

Although this invention has been described in certain specific exemplary embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents.

What is claimed is:

1. An N-way Doherty Amplifier to be coupled with a load having a characteristic impedance of $Z_0$, where N is an integer greater than three (3), the N-way Doherty Amplifier comprising:
    a carrier amplifier including an offset line with a characteristic impedance in an output thereof, the offset line converting the output impedance of the carrier amplifier into a substantially short-circuit when the carrier amplifier is turned off;
    (N−1) peak amplifiers, the peak amplifiers having a same configuration as a configuration of the carrier amplifier, each of the peak amplifiers including an offset line in an output thereof to convert the output impedance thereof into a substantially short circuit when each peak amplifier is being turned off;
    an N-way power divider that evenly divides an input signal into N divided signals provided to the carrier amplifier and the peak amplifiers, the divided signals having phases aligned from each other;
    a phase compensator that includes a quarter wavelength line corresponding to the carrier amplifier and a quarter-wavelength line corresponding to each of the (N−1) peak amplifiers, the quarter-wavelength line corresponding to the carrier amplifier being a first line and having an electrical length of (N−2)*λ/4, where λ is a wavelength of the input signal, the quarter-wavelength line corresponding to a first of the peak amplifiers being a second line and having an electrical length of (N−3)*λ/4, the quarter-wavelength lines corresponding to the rest of the peak amplifiers each having an electrical length of (N−k−1)*λ/4, for k=2 to N−1, the quarter-wavelength lines each having the characteristic impedance; and
    an output combiner including a common node and (N−1) quarter-wavelength lines that correspond to the (N−1) peak amplifiers, respectively, the carrier amplifier being directly coupled with the common node, the first peak amplifier being coupled with the common node through a first quarter-wavelength line of the output combiner, and a j-th peak amplifier where j=2 to N−1 of the rest of the peak amplifiers being coupled with the common node through an i-th quarter-wavelength line of the output combiner where i=j to 2, each i-th quarter wavelength line of the output combiner being connected in series with respect to the common node.

2. The N-way Doherty amplifier according to claim 1, wherein the output combiner further includes an additional line having an electrical length of λ/2, the carrier amplifier being coupled with the common node through the additional line.

3. The N-way Doherty amplifier according to claim 1, wherein the j-th quarter-wavelength line in the output combiner has an impedance of $Z_0/(N-j)$.

4. The N-way Doherty amplifier according to claim 1, further including an output quarter-wavelength line provided between the common node and the load, the output quarter-wavelength line having an electrical length of $\lambda/4$ and an impedance of $Z_0/\sqrt{N}$.

5. A 4-way Doherty Amplifier to be coupled with a load having a characteristic impedance of $Z_0$, the 4-way Doherty Amplifier comprising:
- a carrier amplifier including an offset line with a characteristic impedance in an output thereof, the offset line converting the output impedance of the carrier amplifier into a substantially short circuit when the carrier amplifier is turned off;
- a first peak amplifier, a second peak amplifier, and a third peak amplifier, the first to third peak amplifiers each having a same configuration as a configuration of the carrier amplifier, each of the first to third peak amplifiers including an offset line in an output thereof that converts the output impedance of each of the peak amplifiers into a substantially short circuit when each peak amplifier is being turned off;
- an input power divider that evenly divides an input signal for the carrier amplifier and the first to third peak amplifiers and relatively delays a phase by $\pi$ for the carrier amplifier, $\pi/2$ for the first and second peak amplifiers, and 0 for the third peak amplifier; and
- an output combiner including a common node, a first quarter-wavelength line, a second quarter-wavelength line, and third quarter wave line each corresponding to the first to third peak amplifiers, respectively, the carrier amplifier being directly coupled with the common node, the first peak amplifier being coupled with the common node through the first quarter-wavelength line, the second peak amplifier being coupled with the common node through the second quarter-wavelength line, and the third peak amplifier being coupled with the common node through the second and third quarter-wavelength lines that are connected in series with the common node.

6. The 4-way Doherty amplifier according to claim 5, wherein the input power divider includes three quadrature couplers, one of the couplers receiving the input signal and the other two couplers being coupled in parallel with the one coupler, the other two couplers outputting four signals divided from the input signal and respectively having relative phase delays of $\pi$, $\pi/2$, $\pi/2$, and 0.

7. The 4-way Doherty amplifier according to claim 5, wherein the output combiner further includes an additional line having an electrical length of $\lambda/2$, the carrier amplifier being coupled with the common node through the additional line.

8. The 4-way Doherty amplifier according to claim 5, wherein the second quarter-wavelength line in the output combiner has an impedance of $Z_0/2$ and the third quarter-wavelength line in the output combiner has the characteristic impedance.

9. The N-way Doherty amplifier according to claim 5, further including an output quarter-wavelength line provided between the common node and the load, the output quarter-wavelength line having an electrical length of $\lambda/4$ and an impedance of $Z_0/2$.

* * * * *